(12) United States Patent
Sugiyama et al.

(10) Patent No.: US 7,629,658 B2
(45) Date of Patent: Dec. 8, 2009

(54) VERTICAL SPIN TRANSISTOR AND METHOD OF MANUFACTURING THE SAME

(75) Inventors: Naoharu Sugiyama, Yokohama (JP); Yoshiaki Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 207 days.

(21) Appl. No.: 11/855,322

(22) Filed: Sep. 14, 2007

(65) Prior Publication Data
US 2008/0217711 A1 Sep. 11, 2008

(30) Foreign Application Priority Data
Mar. 8, 2007 (JP) .............................. 2007-058782

(51) Int. Cl.
*H01L 29/82* (2006.01)
(52) U.S. Cl. .......... 257/421; 257/E21.41; 257/E29.323; 438/3
(58) Field of Classification Search .................. 257/421, 257/E21.41, E29, 323; 438/3
See application file for complete search history.

(56) References Cited

U.S. PATENT DOCUMENTS

| 6,369,438 | B1 | 4/2002 | Sugiyama et al. |
| 6,607,948 | B1 | 8/2003 | Sugiyama et al. |
| 6,855,564 | B2 * | 2/2005 | Cha .............................. 438/3 |
| 2006/0118839 | A1 * | 6/2006 | Sugahara et al. ............. 257/295 |
| 2009/0039401 | A1 * | 2/2009 | Tanaka et al. ................ 257/295 |

FOREIGN PATENT DOCUMENTS

JP 10-22501 1/1998

\* cited by examiner

*Primary Examiner*—Trung Dang
(74) *Attorney, Agent, or Firm*—Finnegan, Henderson, Farabow, Garrett & Dunner, L.L.P.

(57) ABSTRACT

A vertical spin transistor according to an embodiment of the present invention includes: a first source/drain layer including a layer formed of magnetic material; a protruding structure including, a channel layer formed on the first source/drain layer and including a layer formed of semiconductor, and a second source/drain layer formed on the channel layer and including a layer formed of magnetic material; a gate insulating film formed on a side of the channel layer; and a gate electrode formed on a surface of the gate insulating film.

22 Claims, 9 Drawing Sheets

VERTICAL SPIN TRANSISTOR AND METHOD OF MANUFACTURING THE SAME

CROSS REFERENCE TO RELATED APPLICATION

This application is based upon and claims the benefit of priority from prior Japanese Patent Application No. 2007-58782, filed on Mar. 8, 2007, the entire contents of which are incorporated herein by reference.

BACKGROUND OF THE INVENTION

1. Field of the Invention

The present invention relates to a vertical spin transistor and a method of manufacturing the same.

2. Background Art

Conventionally, increases in speed and improvements of performance of MOSFETs have been realized mainly by reducing the device size. However, in recent years, due to the limit in the lithography technique, various proposals concerning new channel materials and channel structures have been actively made. A representative example is a strain application technique for applying strain to Si crystals in a channel section. Besides, a method of using SiGe crystals or Ge crystals in a channel section of a p-type MOSFET is also reported. It is known that the application of strain is also effective for the SiGe crystals and the Ge crystals.

There is also proposed a method such as forming the strained semiconductor layers on a substrate including a semiconductor substrate, an embedded insulating film, and a semiconductor layer, to reduce junction capacitance. According to this method, a strained Si layer is formed by depositing an Si layer on an SiGe layer of an SGOI (Silicon Germanium on Insulator) substrate, instead of depositing an Si layer on an SiGe substrate. In this case, it is reported that, in forming an n-type MOSFET, a device having a high driving current can be realized by using an SGOI substrate having an SiGe layer with lattice relaxation at a Ge composition ratio of about 20%. On the other hand, in forming a p-type MOSFET, it is effective to form a strained SiGe layer or a strained Ge layer on a GOI (Germanium on Insulator) substrate.

An SGOI structure and a GOI structure can be formed by Ge condensation method. The Ge condensation method makes use of a characteristic that Si atoms selectively combine with O atoms when an SOI (Silicon on Insulator) substrate which has an SiGe crystal layer formed on an Si layer of the SOI substrate by epitaxial growth is thermally oxidized at a high temperature. Consequently, the Si atoms are oxidized while the Si layer and the SiGe layer are mixed. As a result, the SiGe layer is thinned and Ge atoms in the SiGe layer are condensed, so that an SGOI structure having a high Ge concentration is formed. Specifically, for example, by forming an SiGe layer having a Ge composition ratio of 10% and the thickness of 200 nm on an Si layer having the thickness of 50 nm on an SOI substrate by epitaxial growth, and thermally oxidizing the SOI substrate at a temperature of 1200 degrees Celsius, an SiGe layer (an SGOI layer) having a Ge composition ratio of 20% and the thickness of 100 nm is obtained. By further continuing the thermal oxidation, a Ge layer (a GOI layer) having the thickness of 20 nm is obtained. In this case, since a melting point of the SiGe layer falls as the Ge composition ratio rises, it is necessary to lower an oxidation temperature gradually to be lower than the melting point.

Here, the strained semiconductor layers will be considered again. In an n-type MOSFET in which strained Si is used for a channel, improvement of a driving current by several tens % to two times can be expected. On the other hand, concerning a p-type MOSFET in which Ge or strained Ge is used for a channel, improvement of mobility by several times or more is reported. Considering a combination with such a p-type MOSFET, a transistor having a higher driving current is required as the n-type MOSFET.

As another technique for coping with the limit in the lithography technique, there is proposed a vertical transistor that makes it possible to realize a channel structure having a short channel length. JP-A H10-22501 (KOKAI) discloses a vertical MOSFET in which a source layer made of a lattice-relaxed SiGe layer is formed on an Si substrate, a channel layer made of a strained Si layer is formed on the source layer, and a drain layer made of an SiGe layer is formed on the channel layer. According to this structure, since, in the band structure of the source/channel interface, the energy level of the conduction band is higher on the source side, it is possible to lead accelerated electrons into the channel layer. In particular, if the channel length is short, the electrons reach the source layer before the speed of the accelerated electrons falls. Therefore, by reducing the channel length, it is possible to realize a high-speed switching device exceeding the conventional limit, due to a synergistic effect with the strain of the channel layer. Moreover, there is also a proposal such as forming a vertical transistor on an SGOI substrate or a GOI substrate.

Besides these new transistors in which channel materials and channel structures are improved, transistors having new functions are also proposed. An example of the transistors is a spin transistor. In the spin transistor, both of a source section and a drain section are formed of magnetic material, and the ON characteristic of the transistor is changed by coincidence and anticoincidence of spin directions of the source section and the drain section. The spin direction can be changed again and again after the transistor is formed, if the transistor has a spin writing line. Therefore, if a gate array of a large number of transistors is formed of spin transistors, it is possible to rewrite the circuit characteristic after the integrated circuit is manufactured. Consequently, a programmable integrated circuit is realized.

However, there is a problem that it is difficult to manufacture the spin transistor. In particular, difficulty in forming source and drain sections is often a problem. This is because, when the source and drain sections are formed, a process such as forming trenches in a substrate and embedding magnetic material in the trenches is necessary.

SUMMARY OF THE INVENTION

An embodiment of the present invention is, for example, a vertical spin transistor including: a first source/drain layer including a layer formed of magnetic material; a protruding structure including, a channel layer formed on the first source/drain layer and including a layer formed of semiconductor, and a second source/drain layer formed on the channel layer and including a layer formed of magnetic material; a gate insulating film formed on a side of the channel layer; and a gate electrode formed on a surface of the gate insulating film.

Another embodiment of the present invention is, for example, a method of manufacturing a vertical spin transistor, the method including: forming a first source/drain layer including a layer formed of magnetic material; forming a protruding structure including, a channel layer formed on the first source/drain layer and including a layer formed of semiconductor, and a second source/drain layer formed on the channel layer and including a layer formed of magnetic material; forming a gate insulating film on a side of the channel layer; and forming a gate electrode on a surface of the gate insulating film.

DESCRIPTION OF THE EMBODIMENTS

First Embodiment

Figure 1:
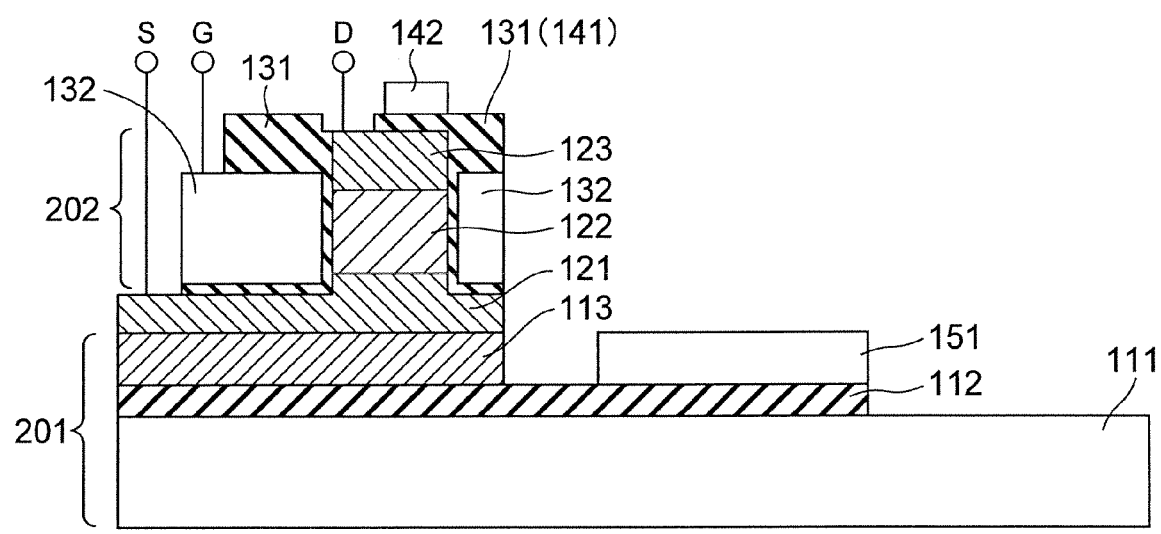
FIG. 1 is a side sectional view of a vertical spin transistor according to a first embodiment of the present invention.

FIG. 1 is a side sectional view of a vertical spin transistor 101 according to a first embodiment of the present invention. A substrate 111, an insulating film 112, and a semiconductor layer 113 are present below the vertical spin transistor 101. The vertical spin transistor 101 includes a first source/drain layer 121, a channel layer 122, a second source/drain layer 123, a gate insulating film 131, a gate electrode 132, an insulating layer 141, and a spin writing line 142.

The substrate 111 is, here, a semiconductor substrate, specifically, a silicon substrate formed of silicon. The insulating film 112 is formed on the substrate 111. The insulating film 112 is, here, an embedded insulating film formed of insulator, specifically, an embedded silicon oxide film formed of silicon oxide. The semiconductor layer 113 is formed on the insulating film 112. The semiconductor layer 113 is, here, a Ge layer formed of Ge (germanium). The vertical spin transistor 101 is provided on a multilayer substrate 201 including the semiconductor substrate 111, the embedded insulating film 112, and the semiconductor layer 113. The multilayer substrate 201 is, here, a GOI (Germanium on Insulator) substrate.

The first source/drain layer 121 is formed on the semiconductor layer 113. The first source/drain layer 121 is, here, a magnetic layer formed of magnetic material, specifically, an $Fe_3Si$ ferromagnetic layer formed of $Fe_3Si$. The channel layer 122 is formed on the first source/drain layer 121. The channel layer 122 is, here, a semiconductor layer formed of semiconductor, specifically, a III-V compound semiconductor layer or a group IV semiconductor layer formed of GaAs or Ge. The second source/drain layer 123 is formed on the channel layer 122. The second source/drain layer 123 is, here, a magnetic layer formed of magnetic material, specifically, an $Fe_3Si$ ferromagnetic layer formed of $Fe_3Si$. The vertical spin transistor 101 includes a protruding structure 202 that protrudes over the first source/drain layer 121 and includes the channel layer 122 and the second source/drain layer 123. The shape of the protruding structure 202 is, here, plate-like. However, the shape of the protruding structure 202 does not have to be plate-like. The first and second source/drain layers 121 and 123 are, here, a source layer and a drain layer, respectively. However, the first and second source/drain layers 121 and 123 may be a drain layer and a source layer, respectively.

As shown in FIG. 1, the gate insulating film 131 and the gate electrode 132 are stacked on a side of the channel layer 122. The gate insulating film 131 is formed on a side of the channel layer 122. The gate electrode 132 is formed on a surface of the gate insulating film 131. The gate insulating film 131 is, here, formed of silicon oxide. The gate electrode 132 is, here, formed of polysilicon or poly-silicon-germanium doped as a p-type or an n-type. The gate insulating film 131 may be a high-permittivity insulating film (a high-k film) in which metal such as Zr, Hf, or La is added in a silicon oxide film, such as an Hf silicate film or a Zr silicate film. The gate electrode 132 may be a metal electrode of TiN, TaN, or the like. It is assumed that the gate insulating film 131 and the gate electrode 132 are, here, provided around the side of the channel layer 122. However, the gate insulating film 131 and the gate electrode 132 do not have to be provided around the side of the channel layer 122.

As shown in FIG. 1, the insulating layer 141 and the spin writing line 142 are stacked on an upper surface of the second source/drain layer 123. The insulating layer 141 is formed on the second source/drain layer 123. The spin writing line 142 is formed on the insulating layer 141. The insulating layer 141 is, here, the same layer as the gate insulating film 131, but may be a different layer from the gate insulating film 131. The spin writing line 142 is a wiring for controlling the spin direction of the second source/drain layer 123 which is a magnetic layer. This spin direction is controlled by current control writing in the first embodiment. However, as in the second to fifth embodiments, this spin direction may be controlled by spin injection writing or voltage control writing.

As described above, the spin transistor 101 in FIG. 1 includes the first source/drain layer 121, the channel layer 122 formed on the first source/drain layer 121, the second source/drain layer 123 formed on the channel layer 122, the gate insulating film 131 formed on a side of the channel layer 122 (a side of the protruding structure 202), and the gate electrode 132 formed on a surface of the gate insulating film 131. In other words, the spin transistor 101 in FIG. 1 is not a plane spin transistor employing a plane structure, but is a vertical spin transistor employing a vertical structure. Therefore, it is easy to manufacture the spin transistor (the vertical spin transistor) 101 in FIG. 1 compared with the conventional spin transistor (the plane spin transistor). For example, when source/drain sections of the spin transistor 101 in FIG. 1 are formed, it is unnecessary to form trenches in a substrate and embed magnetic material in the trenches. In this way, according to this embodiment, difficulty in manufacturing a spin transistor is reduced. In addition, according to this embodiment, a spin transistor, which has an advantage that it is rewritable, can further include an advantage of a vertical transistor that the channel length is short exceeding the limit of the lithography technique.

Figure 2:
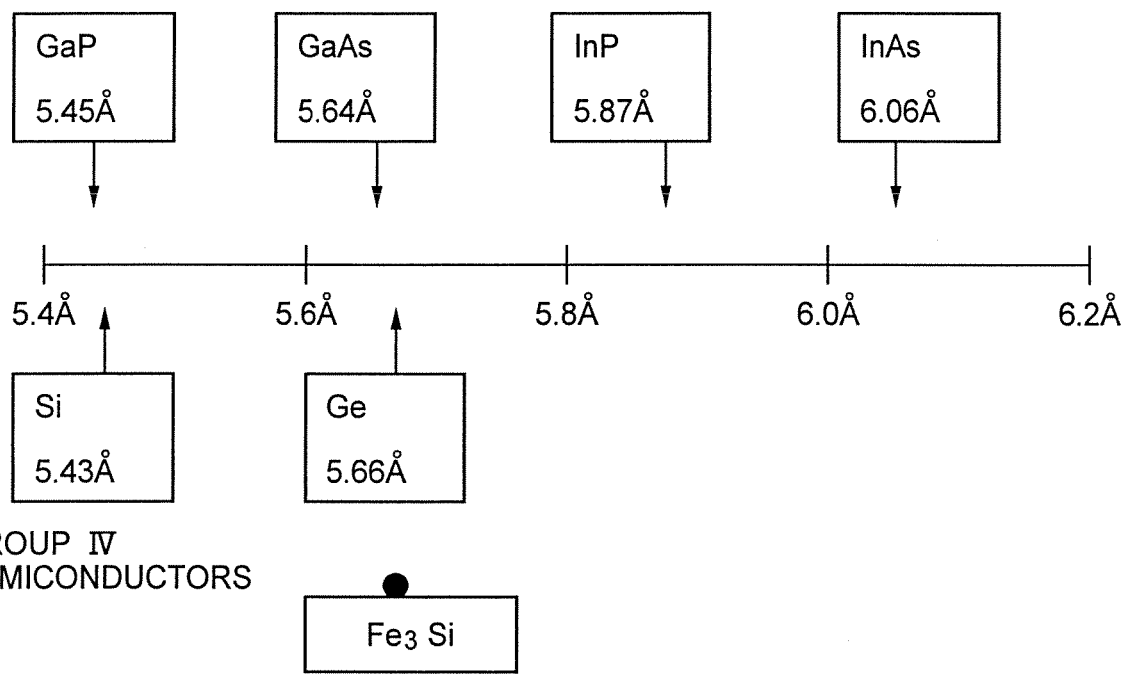
FIG. 2 is a diagram for comparing lattice constants of III-V compound semiconductors and group IV semiconductors.

FIG. 2 is a diagram for comparing lattice constants of III-V compound semiconductors and group IV semiconductors.

The first and second source/drain layers 121 and 123 according to this embodiment are formed of $Fe_3Si$. The lattice constant of $Fe_3Si$ slightly changes according to a formation temperature and the like, but almost coincides with the lattice constants of Ge and GaAs. Therefore, it is possible to form a suitable Ge layer or GaAs layer on an $Fe_3Si$ layer and to form a suitable $Fe_3Si$ layer on a Ge layer or a GaAs layer. Therefore, in this embodiment, Ge or GaAs is adopted as material for forming the channel layer 122. The adoption of Ge which is group IV semiconductor has an advantage that it is relatively easy to secure the material. The adoption of GaAs which is III-V compound semiconductor has an advantage that it is possible to form the channel layer 122 with III-V compound semiconductor having high electron mobility and to realize an n-type MOSFET having a high driving current.

Another example of III-V compound semiconductors adoptable as material for forming the channel layer 122 is InGaR As shown in FIG. 2, the lattice constant of GaP is smaller compared with the lattice constant of $Fe_3Si$, and the lattice constant of InP is larger compared with the lattice constant of $Fe_3Si$. Therefore, the lattice constant of InGaP can be set to a value close to the lattice constant of $Fe_3Si$ by adjusting a mixing ratio of In and Ga. Such InGaP is adopted as material for forming the channel layer 122. Consequently, an n-type MOSFET having a high driving current is realized. Another III-V compound semiconductor having lattice constant close to that of $Fe_3Si$ may be adopted as material for forming the channel layer 122.

Furthermore, in this embodiment, Ge is adopted as material for forming the semiconductor layer 113. This is because the lattice constant of Ge almost coincides with the lattice constant of $Fe_3Si$. The semiconductor layer 113 according to this embodiment is a semiconductor layer formed on an insulating film formed on a semiconductor substrate, but the semiconductor layer 113 may be a semiconductor substrate. In other words, the Ge layer 113 may be a Ge substrate rather than a GOI layer of the GOI (Germanium on Insulator) substrate 201. However, when the semiconductor layer above the semiconductor substrate is adopted as the semiconductor layer 113, there is an advantage that it is possible to reduce junction capacitance. Furthermore, when the GOI layer of the GOI substrate 201 is adopted as the Ge layer 113, there is an advantage that it is easy to employ a substrate having a diameter larger than that of the Ge substrate.

It is desirable that lattice mismatching between the semiconductor layer 113 and the channel layer 122 is smaller than 1%. If the lattice mismatching is smaller than 1%, high-quality hetero-growth can be realized in general. Conversely, if the lattice mismatching is larger than 1%, since an occurrence probability of dislocation increases according to an increase in a film thickness in general, it is necessary to pay attention to film thickness design. Similarly, it is desirable that lattice mismatching among the semiconductor layer 113, the first and second source/drain layers 121 and 123, and the channel layer 122 is smaller than 1%. Lattice mismatching between Ge and GaAs is about 0.4%, when the lattice mismatching is calculated from the lattice constants in FIG. 2. On the other hand, lattice mismatching between Si and GaAs is about 40%, when the lattice mismatching is calculated from the lattice constants in FIG. 2.

1) Semiconductor Layer 113

The semiconductor layer 113 will be explained.

The semiconductor layer 113 may be an Si (silicon) layer or an SiGe (silicon germanium) layer. In the former case, the semiconductor layer 113 may be an SOI layer of an SOI (Silicon on Insulator) substrate or an Si substrate. In general, the Si substrate is provided at lower cost than the SOI substrate. In the latter case, the semiconductor layer 113 may be an SGOI layer of an SGOI (Silicon Germanium on Insulator) substrate or an SiGe substrate.

In these cases, it is also possible to select materials other than $Fe_3Si$ and GaAs as materials for forming the first and second source/drain layers 121 and 123 and the channel layer 122. In this case, it is necessary to take into account an influence of lattice interval of the semiconductor layer 113 on lattice intervals of the first and second source/drain layers 121 and 123 and the channel layer 122. It is desirable to match the lattice constant of the first and second source/drain layers 121 and 123 with the lattice constant of the semiconductor layer 113 as much as possible. However, the lattice constant of the channel layer 122 may be slightly different from the lattice constant of the semiconductor layer 113. This is because, thereby, strain is introduced into the semiconductor which forms the channel layer 122 and mobility of carriers in the channel layer 122 is improved.

Figure 3:
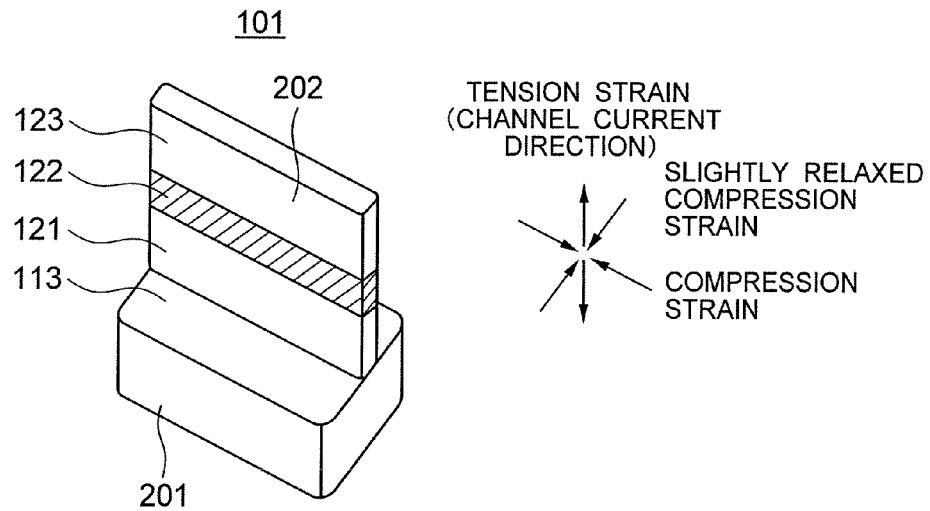
FIG. 3 is a diagram for explaining a semiconductor layer 113.

For example, the semiconductor layer 113 is an SiGe layer having a Ge composition ratio of 80%, the first source/drain layer 121 is a magnetic layer which matches this layer, and the channel layer 122 is a Ge layer. In this case, since the lattice constant of the channel layer 122 is slightly larger than the lattice constant of the semiconductor layer 113, the channel layer 122 is subjected to compression strain and contracts in a horizontal direction, and is subjected to tension strain and expands in a vertical direction (FIG. 3). Since an application direction of the tension strain is a channel current direction, the mobility of carriers in the channel layer 122 increases according to the tension strain.

An example of magnetic material, other than $Fe_3Si$, for forming the first and second source/drain layers 121 and 123 is full Heusler alloy. The material for forming the first source/drain layer 121 and the material for forming the second source/drain layer 123 may be the same material or different materials.

2) Surface Structure of the Semiconductor Layer 113

A surface structure of the semiconductor layer 113 will be explained.

Figure 4:
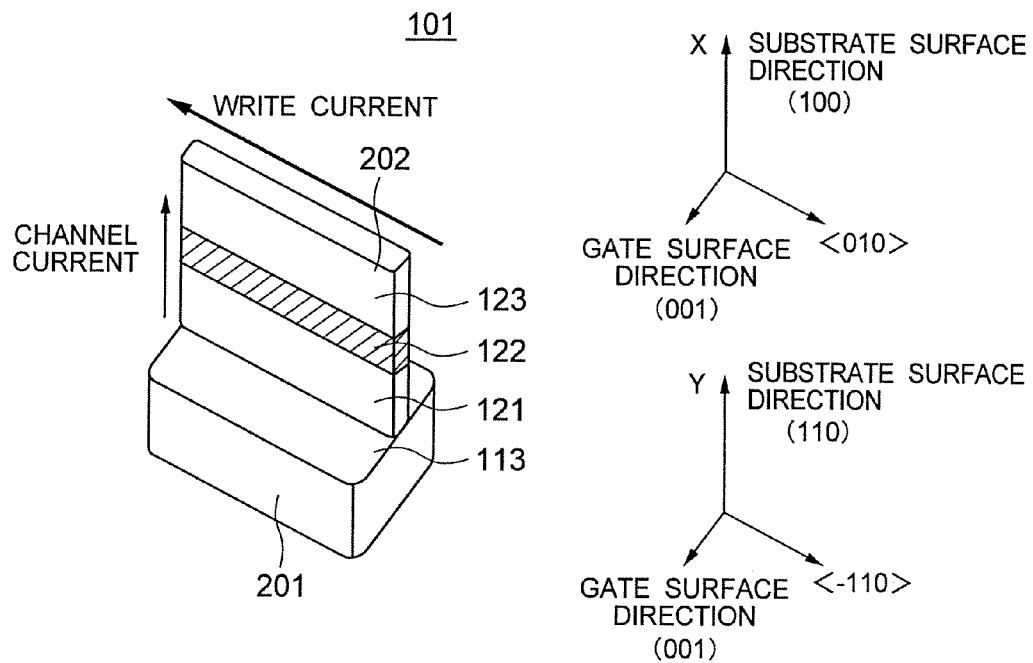
FIG. 4 is a diagram for explaining a surface structure of the semiconductor layer 113.

A surface (an upper surface) of the semiconductor layer 113 is, here, a (100) plane, as indicated by a coordinate system "X" in FIG. 4. In Si-LSI, a substrate having a (100) plane as its principal plane is usually adopted. Therefore, it is not particularly difficult to form the surface of the semiconductor layer 113 as a (100) plane.

In this case, since a channel current direction of the transistor 101 is a <100> direction, there is no problem in device design. Furthermore, in this case, it is possible to form the protruding structure 202 in a thin plate-like shape having two wide sides and two narrow sides and to form the two wide sides as (001) planes. In addition, when the gate insulating film 131 is formed on sides of the channel layer 122, it is possible, by forming most parts of the gate insulating film 131 on (001) planes, to form interfaces having low interface levels. If the thickness of the plate-like shape is set to be smaller than 20 nm, a structure having an advantage for a short channel effect is obtained.

The surface (the upper surface) of the semiconductor layer 113 may be a (110) plane, as indicated by a coordinate system "Y" in FIG. 4. In this case, since a channel current direction of the transistor 101 is a <110> direction, mobility of a p-type channel is improved. Furthermore, in this case, as in the above case, it is possible to form the protruding structure 202 in a thin plate-like shape having two wide sides and two narrow sides and to form the two wide sides as (001) planes. The advantage in this case is the same as that in the above case.

3) Spin Writing Line 142

The spin writing line 142 will be explained.

In this embodiment, the spin transistor 101 has the spin writing line 142. Therefore, in this embodiment, it is possible to change a characteristic of the transistor 101 after the transistor 101 is formed.

In this embodiment, both of the upper source/drain layer 123 and the lower source/drain layer 121 are magnetic layers. However, in this embodiment, although the spin writing line 142 for controlling the spin direction of the upper source/drain layer 123 is provided, a spin writing line for controlling the spin direction of the lower source/drain layer 121 is not provided. This is because, for the purpose of controlling coincidence and anticoincidence of the spin directions of the upper source/drain layer 123 and the lower source/drain layer 121, it is unnecessary to provide spin rewrite mechanisms for both of the source/drain layers, and it is sufficient to provide a spin rewrite mechanism for one of the source/drain layers. In this embodiment, when the device is formed, both of the upper source/drain layer 123 and the lower source/drain layer 121 are magnetized, and the spin directions of the source/drain layers are aligned. On the other hand, when the characteristic of the transistor 101 is changed, the spin direction of the upper source/drain layer 123 is rewritten, and the characteristic of the transistor 101 is changed.

Moreover, in this embodiment, a vertical structure is adopted as a structure of the spin transistor 101. Therefore, in this embodiment, it is possible to provide the spin writing line 142 above the vertical structure, i.e., above the upper source/drain layer 123. Therefore, in this embodiment, it is possible to easily form the spin writing line 142.

4) CMOSFET

In this embodiment, an SiGe crystal layer is formed on an Si layer of an SOI (Silicon on Insulator) substrate by epitaxial growth, and the SOI substrate is thermally oxidized at a high temperature, so that a GOI structure is realized. Therefore, in this embodiment, as shown in FIG. 1, it is possible to form the Ge layer (a semiconductor layer) 113 in a certain area on the substrate 111, and to leave an Si layer (a remaining semiconductor layer) 151 in a certain area on the substrate 111.

Figure 5:
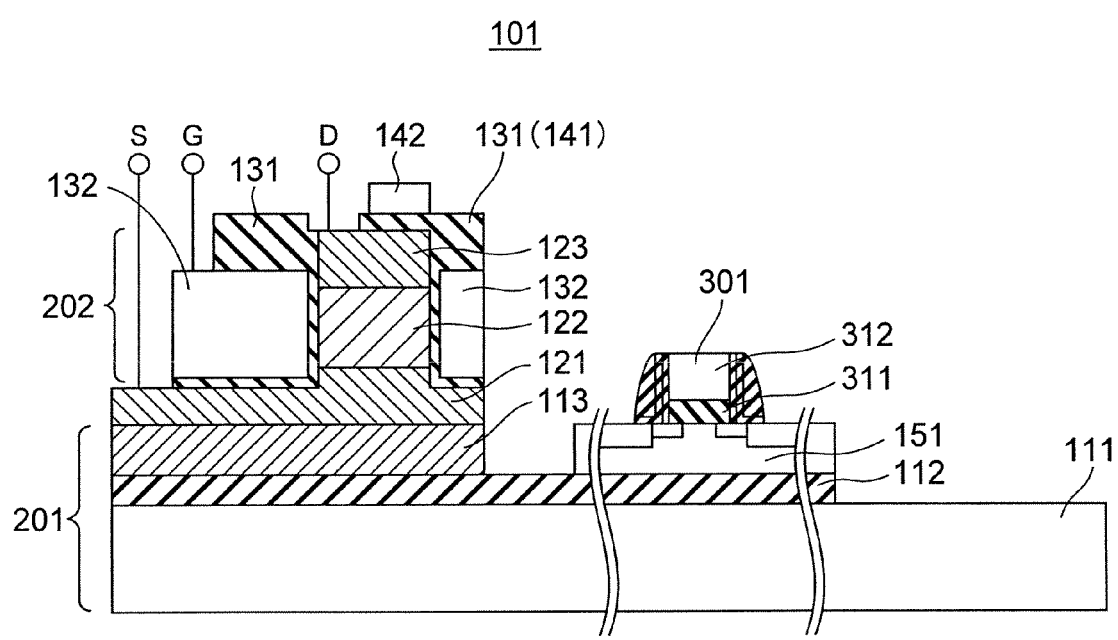
FIG. 5 is a side sectional view of a vertical spin transistor according to the first embodiment (a modification)

Therefore, in this embodiment, as shown in FIG. 5, it is possible to form a transistor 301 on the remaining semiconductor layer 151. The transistor 301 in FIG. 5 is a p-type transistor including a gate insulating film 311 formed on the remaining semiconductor layer 151 and a gate electrode 312 formed on the gate insulating film 311. A memory device may be formed on the remaining semiconductor layer 151.

Figure 6:
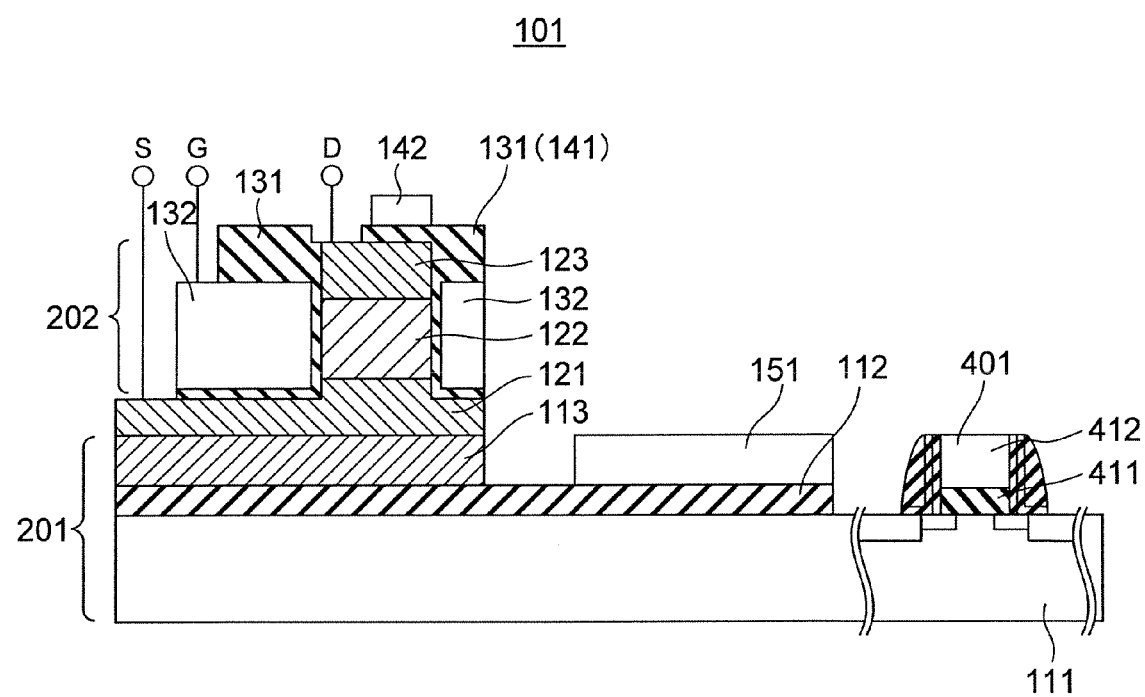
FIG. 6 is a side sectional view of a vertical spin transistor according to the first embodiment (a modification)

On the other hand, in this embodiment, as shown in FIG. 6, it is also possible to peel off the insulating film 112, expose the substrate 111, and form a transistor 401 on an exposed surface of the substrate 111. The transistor 401 in FIG. 6 is a p-type transistor including a gate insulating film 411 formed on the exposed surface of the substrate 111 and a gate electrode 412 formed on the gate insulating film 411. A memory device may be formed on the exposed surface of the substrate 111.

Moreover, epitaxial growth and thermal oxidation may be repeated under several conditions to form both a Ge layer and an SiGe layer on the insulating film 112, to form transistors having characteristics different from each other on the Ge layer and the SiGe layer. For example, it is possible to form a CMOSFET by forming an n-type vertical spin transistor on the Ge layer and forming a p-type transistor on the SiGe layer. In this case, the p-type transistor may be a transistor other than the vertical transistor, such as a planar transistor, a multi-gate transistor, or a gate-all-around transistor. The n-type vertical transistor and the p-type transistor may be formed on the SiGe layer and the Ge layer respectively, instead of being formed on the Ge layer and the SiGe layer respectively. The n-type vertical transistor and the p-type transistor may be formed respectively on a first SiGe layer and a second SiGe layer having Ge composition ratios different from each other.

5) Method of Manufacturing the Vertical Spin Transistor 101

FIGS. 7A to 7H are diagrams for explaining a manufacturing process for the vertical spin transistor 101 according to the first embodiment.

Figure 7A:
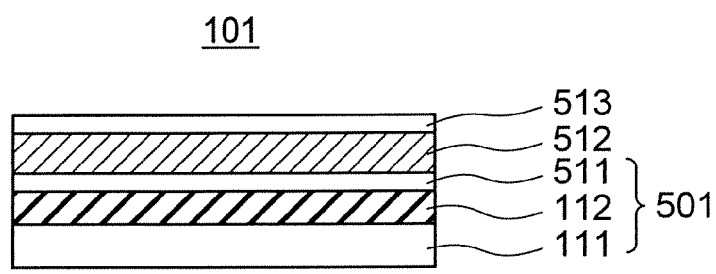
FIGS. 7A to 7H are diagrams for explaining a manufacturing process for the vertical spin transistor according to the first embodiment.

First, an SOI (Silicon on Insulator) substrate 501 is prepared. The SOI substrate 501 has the substrate 111, the insulating film 112, and an Si layer (an SOI layer) 511. The thickness of the Si layer 511 is, here, 20 nm. Then, an SiGe layer 512 is formed on the Si layer 511 and an Si cap layer 513 is formed on the SiGe layer 512, by a UHV-CVD method, an LP-CVD method, or an MBE method. A composition ratio of Si and Ge in the SiGe layer 512 is, here, Si:Ge=0.9:0.1. The thickness of the SiGe layer 512 is, here, 150 nm. The thickness of the Si cap layer 513 is, here, 5 nm (FIG. 7A).

Both of the thickness of the SiGe layer 512 and the thickness of the Si cap layer 513 are smaller than a critical thickness at a growth temperature. Therefore, dislocation does not occur in films of the SiGe layer 512 and the Si cap layer 513.

Figure 7B:
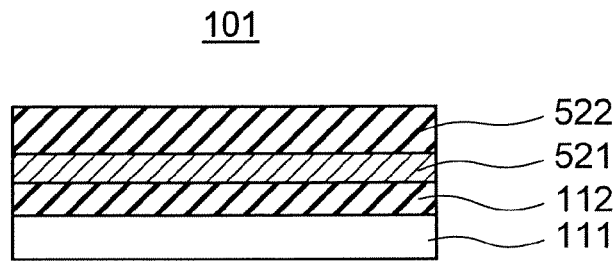

Next, this SOI substrate 501 is placed in an oxidation furnace, and oxidized under a temperature of 1000 degrees Celsius using oxygen gas diluted to 50% by nitrogen until the thickness of the SiGe layer 512 is reduced to 25 nm. By this oxidation, Ge atoms are sufficiently diffused in a crystal layer 521 between the embedded oxide film 112 and a thermal oxide film 522, but the Ge atoms cannot be transmitted through these oxide films. Therefore, as the thermal oxidation progresses, the thickness of the crystal layer 521 decreases and the Ge composition ratio in the crystal layer 521 increases to 70% (FIG. 7B).

In this oxidation, it is necessary to pay attention to prevent an oxidation temperature from exceeding a melting point of SiGe. This is because, as the thermal oxidation progresses, Ge is concentrated and the melting point of SiGe falls. In order to obtain the SiGe crystal layer 521 having a Ge composition ratio of 70%, a final oxidation temperature has to be lower than 1025 degrees Celsius. In order to set an oxidation time as short as possible, it is effective to set an oxidation temperature high immediately after the start of oxidation and lower the oxidation temperature continuously or stepwise as the thermal oxidation progresses.

Figure 7C:
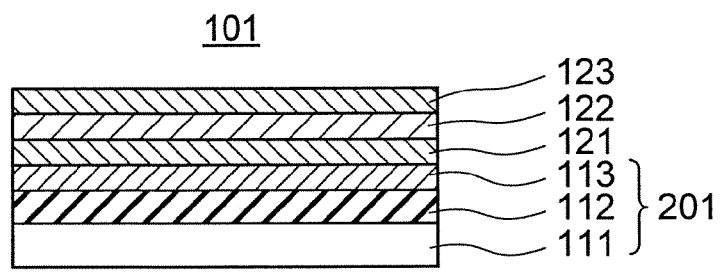

Thereafter, the Ge layer (the semiconductor layer) 113 is obtained by further continuing the thermal oxidation. The semiconductor layer 113 may be the SiGe crystal layer 521 having a Ge composition ratio of 70%. Then, after carrying out surface cleaning, the first $Fe_3Si$ layer (the first source/drain layer) 121, the GaAs layer (the channel layer) 122, and the second $Fe_3Si$ layer (the second source/drain layer) 123 are sequentially deposited over the entire surface of the substrate by a UHV-CVD method, an LP-CVD method, an MBE method, or a sputtering method. The thickness of the first $Fe_3Si$ layer 121 is, here, 50 nm. The thickness of the GaAs layer 122 is, here, 20 nm. The thickness of the second first $Fe_3Si$ layer 123 is, here, 50 nm. The channel layer 122 may be a Ge layer (FIG. 7C).

Figure 7D:
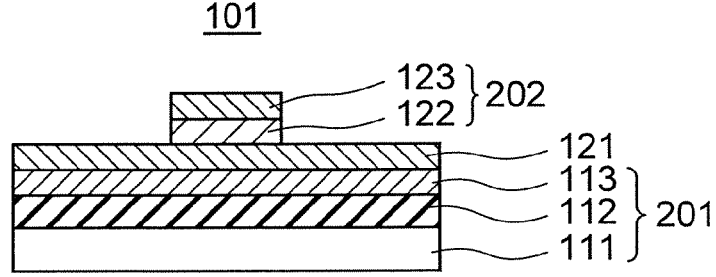

Next, a protective layer such as a deposited oxide film is formed on the second $Fe_3Si$ layer 123, a photoresist is formed on the protective layer, and a resist pattern of the photoresist is formed. Then, the second $Fe_3Si$ layer 123 and the GaAs layer 122 are etched by an RIE process using the resist pattern as a mask. Consequently, the protruding structure 202 including the second Fe$_3$Si layer 123 and the GaAs layer 122 is formed. The resist pattern is peeled off after the etching process (FIG. 7D).

The Fe$_3$Si layer has a characteristic that the Fe$_3$Si layer is less easily etched than the GaAs layer. Therefore, in the above etching process, after the completion of etching of the second Fe$_3$Si layer 123, etching of the GaAs layer 122 is immediately completed. Therefore, it is difficult to stop the above etching process immediately after etching of the GaAs layer 122 is completed. Therefore, in this embodiment, the above etching process may be stopped when etching of the first Fe$_3$Si layer 121 is just started. In this case, a part (an upper part) of the first Fe$_3$Si layer 121 is included in the protruding structure 202 in addition to the second Fe$_3$Si layer 123 and the GaAs layer 122.

Figure 7E:
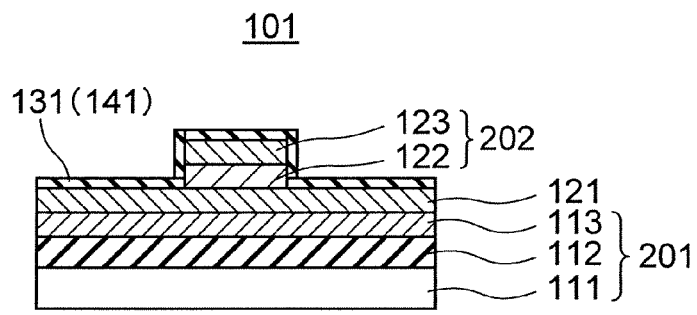

Next, the gate insulating film 131 is deposited over the entire surface of the substrate by a CVD method. Consequently, the gate insulating film 131 surrounding the protruding structure 202 (the channel layer 122) is formed. The thickness of the gate insulating film 131 is, here, 2 nm. The gate insulating film 131 is deposited on a side(s) and an upper surface of the protruding structure 202. The gate insulating film 131 deposited on the upper surface of the protruding structure 202 becomes an insulating layer 141 which constitutes a spin rewrite mechanism (FIG. 7E).

The gate insulating film 131 is, here, a silicon oxide film (SiO$_2$). However, the gate insulating film 131 may be a silicon nitride film (Si$_3$N$_4$) or a silicon oxynitride film (SiO$_x$N$_y$). The gate insulating film 131 may be a high-permittivity insulating film of Al$_2$O$_3$, Ta$_2$O$_5$, TiO$_2$, Y$_2$O$_3$, or HfO$_2$. The gate insulating film 131 may be a high-permittivity insulating film formed by mixing SiO$_2$ and Al$_2$O$_3$, Ta$_2$O$_5$, TiO$_2$, Y$_2$O$_3$, or HfO$_2$. The gate insulating film 131 may be a Ge nitride film or a Ge oxynitride film. The Ge oxynitride film can be formed by a plasma CVD method. The Ge oxynitride film can be also formed by oxynitriding the surface of a Ge layer using ammonium gas or nitride gas.

Figure 7F:
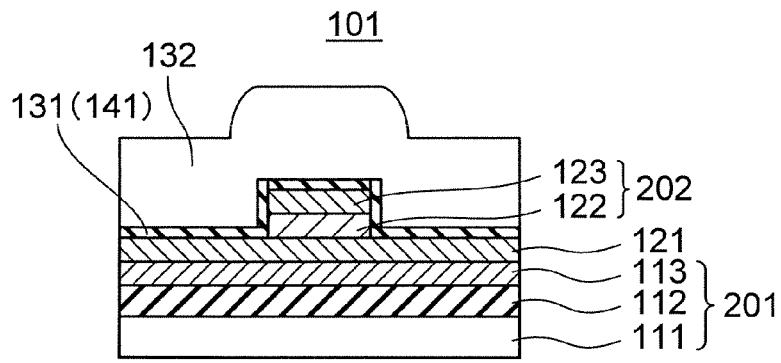

Next, a gate electrode layer 132 is deposited over the entire surface of the substrate by a CVD method. Consequently, the gate electrode layer 132 surrounding the protruding structure 202 (the channel layer 122) is formed. The thickness of the gate electrode layer 132 is, here, 20 to 25 nm. The gate electrode layer 132 is, here, a polysilicon layer. Then, ion implantation into the gate electrode layer 132 is performed to form the gate electrode layer 132 as a high-concentration n-type layer. In the ion implantation, phosphorus is implanted with a dosage of $5\times10^{15}$ cm$^{-2}$. Then, annealing of the wafer is performed (FIG. 7F).

In depositing the gate electrode layer 132 by a CVD method, dopants may be added to the gate electrode layer 132. Consequently, the gate electrode layer 132 having a low resistance is formed. The gate electrode layer 132 may be a metal layer.

Figure 7G:
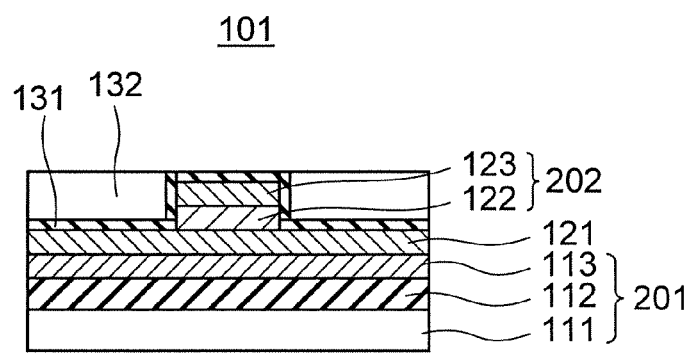

Next, the gate electrode layer 132 above the protruding structure 202 is removed by planarization. Consequently, the gate insulating film 131 (the insulating layer 141) on the protruding structure 202 is exposed. Then, the gate electrode layer 132 is processed by photolithography. Consequently, the gate electrode 132 surrounding the protruding structure 202 is completed (FIG. 7G).

Figure 7H:
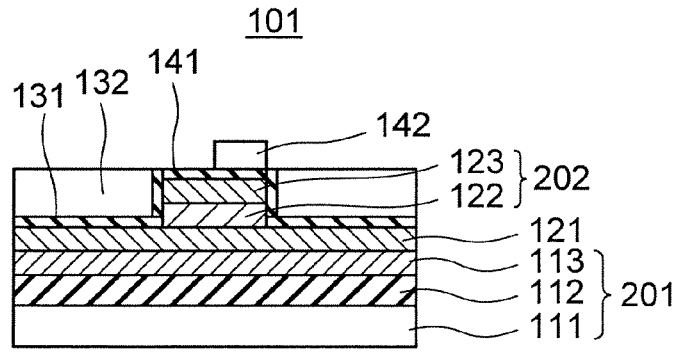

Next, a spin writing line layer 142 is deposited over the entire surface of the substrate by a CVD method. Then, the spin writing line layer 142 is processed by photolithography. Consequently, the spin writing line 142 is formed on the insulating layer 141 (FIG. 7H). Electrodes for a gate, a source, and a drain are formed in the same manner. Before these electrodes are formed, openings are provided in the gate insulating film 131 and the like in advance.

In this way, the vertical spin transistor 101 in FIG. 1 is formed on the GOI substrate 201. Moreover, the transistor 301 in FIG. 5, the transistor 401 in FIG. 6, the transistors explained in the fourth section "4) CMOSFET" or the like may be formed on the substrate 111 by a known method or the like.

Second to fifth embodiments of the present invention will be hereinafter explained. Since the second to fifth embodiments are modifications of the first embodiment, differences from the first embodiment will be mainly explained.

Second Embodiment

Figure 8A:
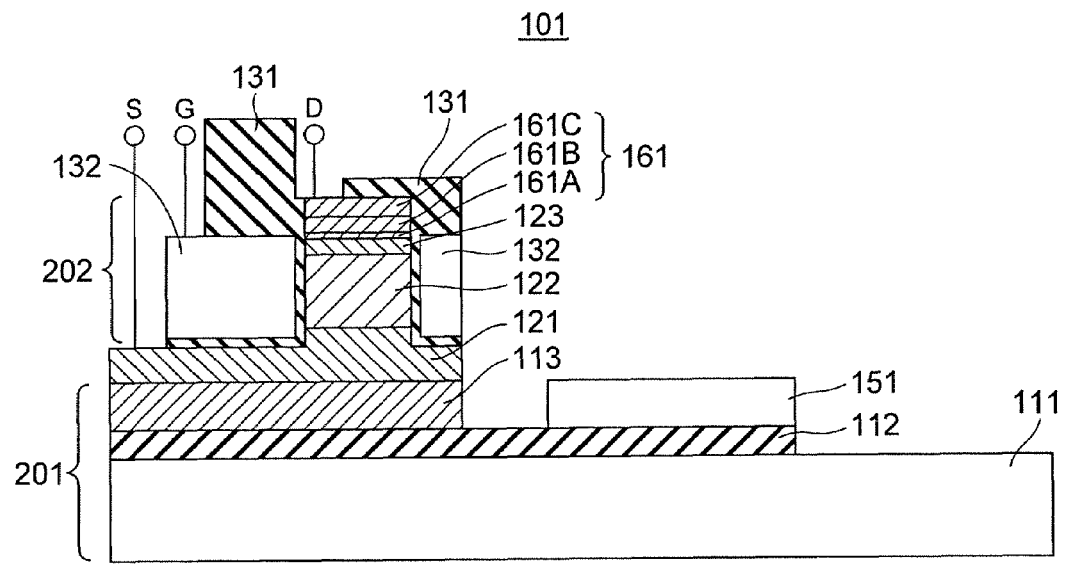
FIG. 8A is a side sectional view of a vertical spin transistor according to a second embodiment of the present invention.

FIG. 8A is a side sectional view of the vertical spin transistor 101 according to the second embodiment. The substrate 111, the insulating film 112, and the semiconductor layer 113 are present below the vertical spin transistor 101 in FIG. 8A. The vertical spin transistor 101 in FIG. 8A includes the first source/drain layer 121, the channel layer 122, the second source/drain layer 123, the gate insulating film 131, the gate electrode 132, and a magnetic recording layer 161.

The vertical spin transistor 101 according to the second embodiment includes, instead of the spin writing line 142, the magnetic recording layer 161 including a magnetic layer. In the vertical spin transistor 101 according to the second embodiment, spin injection writing scheme is adopted instead of current control writing scheme.

The first source/drain layer 121 is formed on the semiconductor layer 113. The first source/drain layer 121 is, here, a magnetic layer formed of magnetic material, specifically, an Fe$_3$Si ferromagnetic layer formed of Fe$_3$Si. The first source/drain layer 121 may be a full Heusler alloy magnetic thin film. As full Heusler alloys adopted for the first source/drain layer 121, due to a high ferromagnetic transition temperature and the like, Co full Heusler alloys such as Co$_2$FeAl$_x$Si$_{1-x}$ and Co$_2$MnSi$_x$Al$_{1-x}$ are preferable.

The channel layer 122 is formed on the first source/drain layer 121. The channel layer 122 is, here, a semiconductor layer formed of semiconductor, specifically, a III-V compound semiconductor layer or a group IV semiconductor layer formed of GaAs or Ge.

The second source/drain layer 123 is formed on the channel layer 122. The second source/drain layer 123 is, here, a magnetic layer formed of magnetic material, specifically, an Fe$_3$Si ferromagnetic layer formed of Fe$_3$Si. The second source/drain layer 123 may be a full Heusler alloy magnetic thin film. As full Heusler alloys adopted for the second source/drain layer 123, due to a high ferromagnetic transition temperature and the like, Co full Heusler alloys such as Co$_2$FeAl$_x$Si$_{1-x}$ and Co$_2$MnSi$_x$Al$_{1-x}$ are preferable.

The magnetic recording layer 161 is formed on the second source/drain layer 123. The magnetic recording layer 161 is, here, a three-layer film formed by sequentially stacking a nonmagnetic layer 161A formed of nonmagnetic material, a magnetic layer 161B formed of magnetic material, and a magnetic layer 161C formed of magnetic material. The nonmagnetic layer 161A is, here, a tunnel barrier layer that functions as a tunnel barrier. The tunnel barrier layer provided in the magnetic recording layer 161 functions as a diffusion barrier and contributes to improvement of breakdown voltage of the device. An example of the tunnel barrier layer is an MgO layer that has the lattice constant close to those of GaAs and Ge and can be epitaxially grown. The nonmagnetic layer 161A may be a bcc nonmagnetic metal layer of Cr, V, or the like. The magnetic layer 161B is, here, an Fe$_3$Si ferromagnetic layer formed of $Fe_3Si$. The magnetic layer 161B may be a full Heusler alloy magnetic thin film. As full Heusler alloys adopted for the magnetic layer 161B, due to a high ferromagnetic transition temperature and the like, Co full Heusler alloys such as $Co_2FeAl_xSi_{1-x}$ and $Co_2MnSi_xAl_{1-x}$ are preferable. The magnetic layer 161C is, here, an antiferromagnetic layer formed of antiferromagnetic material. As antiferromagnetic materials adopted for the magnetic layer 161C, there is no particular limitation, and IrMn, PtMn, and FeMn are cited as examples.

The magnetic recording layer 161 is a layer for controlling the spin direction of the second source/drain layer 123 which is a magnetic layer. In this embodiment, it is possible to change the spin direction (the magnetization direction) of the second source/drain layer 123, according to whether a current is fed upward or downward.

The vertical spin transistor 101 includes the protruding structure 202 including the channel layer 122, the second source/drain layer 123, and the magnetic recording layer 161. The shape of the protruding structure 202 is, here, plate-like. However, the shape of the protruding structure 202 does not have to be plate-like. The first and second source/drain layers 121 and 123 are, here, a source layer and a drain layer, respectively. However, the first and second source/drain layers 121 and 123 may be a drain layer and a source layer, respectively.

Third Embodiment

Figure 8B:
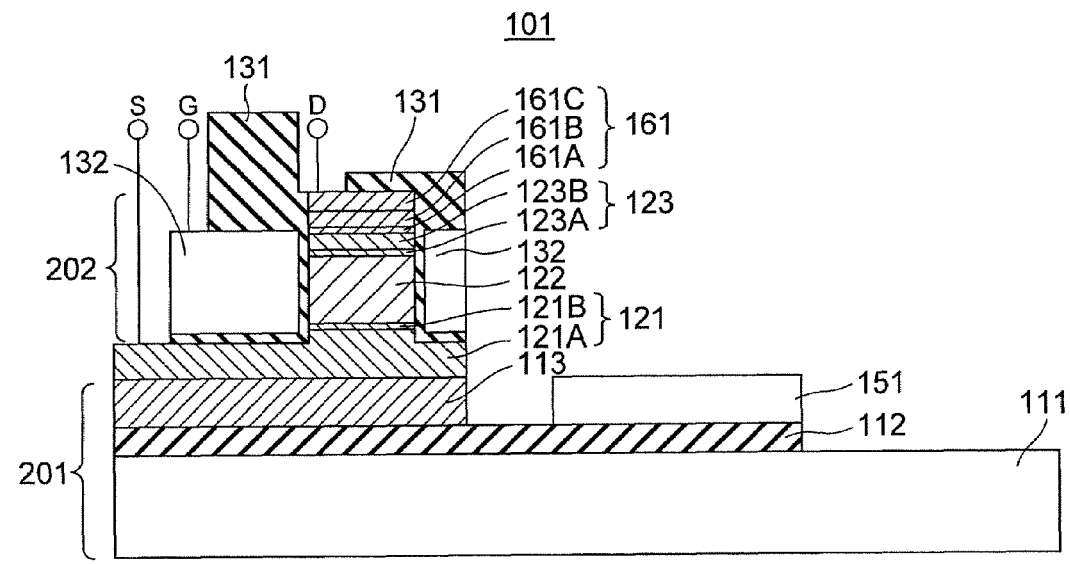
FIG. 8B is a side sectional view of a vertical spin transistor according to a third embodiment of the present invention.

FIG. 8B is a side sectional view of the vertical spin transistor 101 according to the third embodiment. The substrate 111, the insulating film 112, and the semiconductor layer 113 are present below the vertical spin transistor 101 in FIG. 8B. The vertical spin transistor 101 in FIG. 8B includes the first source/drain layer 121, the channel layer 122, the second source/drain layer 123, the gate insulating film 131, the gate electrode 132, and a magnetic recording layer 161.

The vertical spin transistor 101 according to the third embodiment includes, instead of the spin writing line 142, the magnetic recording layer 161 including a magnetic layer. In the vertical spin transistor 101 according to the third embodiment, spin injection writing scheme is adopted instead of current control writing scheme.

The first source/drain layer 121 is formed on the semiconductor layer 113. The first source/drain layer 121 is, here, a two-layer film formed by sequentially stacking a magnetic layer 121A formed of magnetic material, and a nonmagnetic layer 121B formed of nonmagnetic material. The magnetic layer 121A is, here, an $Fe_3Si$ ferromagnetic layer formed of $Fe_3Si$. The magnetic layer 121A may be a full Heusler alloy magnetic thin film. As full Heusler alloys adopted for the magnetic layer 121A, due to a high ferromagnetic transition temperature and the like, Co full Heusler alloys such as $Co_2FeAl_xSi_{1-x}$ and $Co_2MnSi_xAl_{1-x}$ are preferable. The nonmagnetic layer 121B is, here, a tunnel barrier layer that functions as a tunnel barrier. The tunnel barrier layer provided in the first source/drain layer 121 functions as a diffusion barrier and contributes to improvement of breakdown voltage of the device. An example of the tunnel barrier layer is an MgO layer that has the lattice constant close to those of GaAs and Ge and can be epitaxially grown. The nonmagnetic layer 121B may be a bcc nonmagnetic metal layer of Cr, V, or the like.

The channel layer 122 is formed on the first source/drain layer 121. The channel layer 122 is, here, a semiconductor layer formed of semiconductor, specifically, a III-V compound semiconductor layer or a group IV semiconductor layer formed of GaAs or Ge.

The second source/drain layer 123 is formed on the channel layer 122. The second source/drain layer 123 is, here, a two-layer film formed by sequentially stacking a nonmagnetic layer 123A formed of nonmagnetic material, and a magnetic layer 123B formed of magnetic material. The nonmagnetic layer 123A is, here, a tunnel barrier layer that functions as a tunnel barrier. The tunnel barrier layer provided in the second source/drain layer 123 functions as a diffusion barrier and contributes to improvement of breakdown voltage of the device. An example of the tunnel barrier layer is an MgO layer that has the lattice constant close to those of GaAs and Ge and can be epitaxially grown. The nonmagnetic layer 123A may be a bcc nonmagnetic metal layer of Cr, V, or the like. The magnetic layer 123B is, here, an $Fe_3Si$ ferromagnetic layer formed of $Fe_3Si$. The magnetic layer 123B may be a full Heusler alloy magnetic thin film. As full Heusler alloys adopted for the magnetic layer 123B, due to a high ferromagnetic transition temperature and the like, Co full Heusler alloys such as $Co_2FeAl_xSi_{1-x}$ and $Co_2MnSi_xAl_{1-x}$ are preferable.

The magnetic recording layer 161 is formed on the second source/drain layer 123. The magnetic recording layer 161 is, here, a three-layer film formed by sequentially stacking a nonmagnetic layer 161A formed of nonmagnetic material, a magnetic layer 161B formed of magnetic material, and a magnetic layer 161C formed of magnetic material. The nonmagnetic layer 161A is, here, a tunnel barrier layer that functions as a tunnel barrier. The tunnel barrier layer provided in the magnetic recording layer 161 functions as a diffusion barrier and contributes to improvement of breakdown voltage of the device. An example of the tunnel barrier layer is an MgO layer that has the lattice constant close to those of GaAs and Ge and can be epitaxially grown. The nonmagnetic layer 161A may be a bcc nonmagnetic metal layer of Cr, V, or the like. The magnetic layer 161B is, here, an $Fe_3Si$ ferromagnetic layer formed of $Fe_3Si$. The magnetic layer 161B may be a full Heusler alloy magnetic thin film. As full Heusler alloys adopted for the magnetic layer 161B, due to a high ferromagnetic transition temperature and the like, Co full Heusler alloys such as $Co_2FeAl_xSi_{1-x}$ and $Co_2MnSi_xAl_{1-x}$ are preferable. The magnetic layer 161C is, here, an antiferromagnetic layer formed of antiferromagnetic material. As antiferromagnetic materials adopted for the magnetic layer 161C, there is no particular limitation, and IrMn, PtMn, and FeMn are cited as examples.

The magnetic recording layer 161 is a layer for controlling the spin direction of the second source/drain layer 123 which includes a magnetic layer. In this embodiment, it is possible to change the spin direction (the magnetization direction) of the second source/drain layer 123, according to whether a current is fed upward or downward.

The vertical spin transistor 101 includes the protruding structure 202 including the channel layer 122, the second source/drain layer 123, and the magnetic recording layer 161. The shape of the protruding structure 202 is, here, plate-like. However, the shape of the protruding structure 202 does not have to be plate-like. The first and second source/drain layers 121 and 123 are, here, a source layer and a drain layer, respectively. However, the first and second source/drain layers 121 and 123 may be a drain layer and a source layer, respectively.

Fourth Embodiment

Figure 8C:
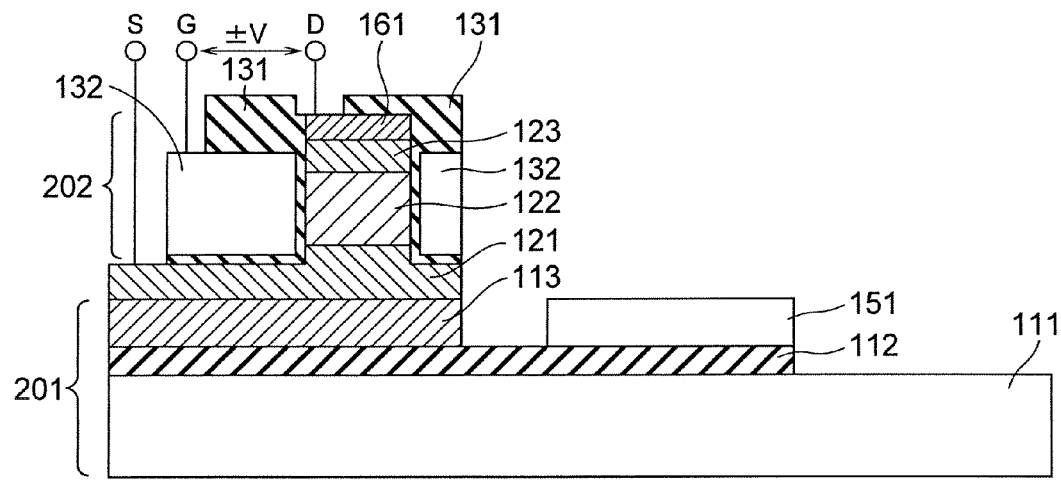
FIG. 8C is a side sectional view of a vertical spin transistor according to a fourth embodiment of the present invention.

FIG. 8C is a side sectional view of the vertical spin transistor 101 according to the fourth embodiment. The substrate 111, the insulating film 112, and the semiconductor layer 113 are present below the vertical spin transistor 101 in FIG. 8C. The vertical spin transistor 101 in FIG. 8C includes the first source/drain layer 121, the channel layer 122, the second source/drain layer 123, the gate insulating film 131, the gate electrode 132, and a magnetic recording layer 161.

The vertical spin transistor 101 according to the fourth embodiment includes, instead of the spin writing line 142, the magnetic recording layer 161 which is a magnetic layer. In the vertical spin transistor 101 according to the fourth embodiment, voltage control writing scheme is adopted instead of current control writing scheme.

The first source/drain layer 121 is formed on the semiconductor layer 113. The first source/drain layer 121 is, here, a magnetic layer formed of magnetic material, specifically, an $Fe_3Si$ ferromagnetic layer formed of $Fe_3Si$. The first source/drain layer 121 may be a full Heusler alloy magnetic thin film. As full Heusler alloys adopted for the first source/drain layer 121, due to a high ferromagnetic transition temperature and the like, Co full Heusler alloys such as $Co_2FeAl_xSi_{1-x}$ and $Co_2MnSi_xAl_{1-x}$ are preferable.

The channel layer 122 is formed on the first source/drain layer 121. The channel layer 122 is, here, a semiconductor layer formed of semiconductor, specifically, a III-V compound semiconductor layer or a group IV semiconductor layer formed of GaAs or Ge.

The second source/drain layer 123 is formed on the channel layer 122. The second source/drain layer 123 is, here, a magnetic layer formed of magnetic material, specifically, an $Fe_3Si$ ferromagnetic layer formed of $Fe_3Si$. The second source/drain layer 123 may be a full Heusler alloy magnetic thin film. As full Heusler alloys adopted for the second source/drain layer 123, due to a high ferromagnetic transition temperature and the like, Co full Heusler alloys such as $Co_2FeAl_xSi_{1-x}$ and $Co_2MnSi_xAl_{1-x}$ are preferable.

The magnetic recording layer 161 is formed on the second source/drain layer 123. The magnetic recording layer 161 is, here, a magnetic layer formed of magnetic material, specifically, an antiferromagnetic ferroelectric layer, a ferromagnetic ferroelectric layer, or a ferrimagnetic ferroelectric layer formed of antiferromagnetic ferroelectric material, ferromagnetic ferroelectric material, or ferrimagnetic ferroelectric material. As magnetic materials adopted for the magnetic recording layer 161, $Cr_2O_3$, $Bi_2FeCrO_6$, $Bi_{1-x}Ba_xFeO_3$, $BiFeO_3$, a $BaTiO_3$—$CoFe_2O_4$ nanostructure, and a $PbTiO_3$—$CoFe_2O_4$ nanostructure are preferable.

The magnetic recording layer 161 is a layer for controlling the spin direction of the second source/drain layer 123 which is a magnetic layer. In this embodiment, it is possible to perform spin writing by applying a voltage between a gate and a drain (or a gate and a source), as indicated by ±V in FIG. 8C. In this embodiment, since voltage application methods in writing and reading are different, it is unnecessary to pay attention to the margin of voltages in writing and reading. This is an example indicating that voltage control writing scheme is more excellent than spin injection writing scheme. In this embodiment, it is possible to change the spin direction (the magnetization direction) of the second source/drain layer 123 according to a change in the voltage ±V.

The vertical spin transistor 101 includes the protruding structure 202 including the channel layer 122, the second source/drain layer 123, and the magnetic recording layer 161. The shape of the protruding structure 202 is, here, plate-like. However, the shape of the protruding structure 202 does not have to be plate-like. The first and second source/drain layers 121 and 123 are a source layer and a drain layer, respectively. However, the first and second source/drain layers 121 and 123 may be a drain layer and a source layer, respectively.

Fifth Embodiment

Figure 8D:
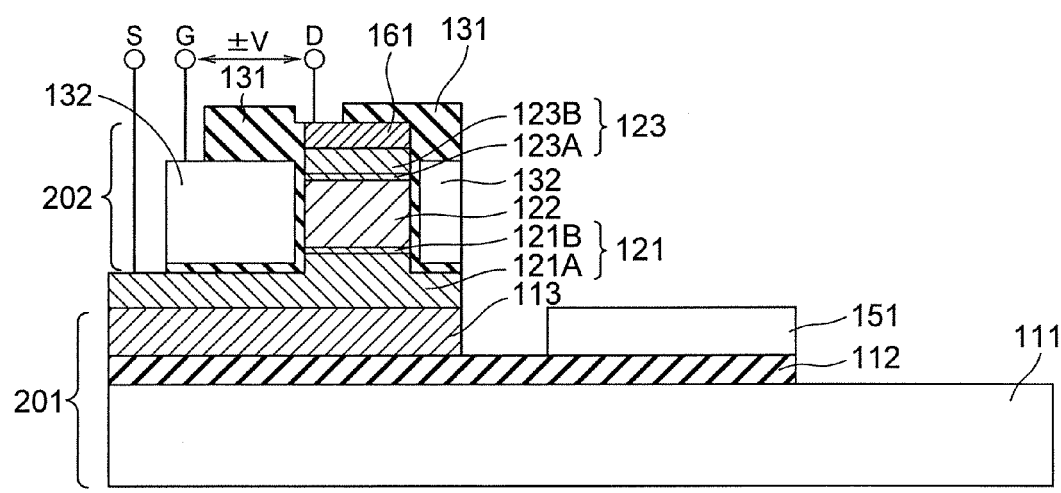
FIG. 8D is a side sectional view of a vertical spin transistor according to a fifth embodiment of the present invention.

FIG. 8D is a side sectional view of the vertical spin transistor 101 according to the fifth embodiment. The substrate 111, the insulating film 112, and the semiconductor layer 113 are present below the vertical spin transistor 101 in FIG. 8D. The vertical spin transistor 101 in FIG. 8D includes the first source/drain layer 121, the channel layer 122, the second source/drain layer 123, the gate insulating film 131, the gate electrode 132, and a magnetic recording layer 161.

The vertical spin transistor 101 according to the fifth embodiment includes, instead of the spin writing line 142, the magnetic recording layer 161 which is a magnetic layer. In the vertical spin transistor 101 according to the fifth embodiment, voltage control writing scheme is adopted instead of current control writing scheme.

The first source/drain layer 121 is formed on the semiconductor layer 113. The first source/drain layer 121 is, here, a two-layer film formed by sequentially stacking a magnetic layer 121A formed of magnetic material, and a nonmagnetic layer 121B formed of nonmagnetic material. The magnetic layer 121A is, here, an $Fe_3Si$ ferromagnetic layer formed of $Fe_3Si$. The magnetic layer 121A may be a full Heusler alloy magnetic thin film. As full Heusler alloys adopted for the magnetic layer 121A, due to a high ferromagnetic transition temperature and the like, Co full Heusler alloys such as $Co_2FeAl_xSi_{1-x}$ and $Co_2MnSi_xAl_{1-x}$ are preferable. The nonmagnetic layer 121B is, here, a tunnel barrier layer that functions as a tunnel barrier. The tunnel barrier layer provided in the first source/drain layer 121 functions as a diffusion barrier and contributes to improvement of breakdown voltage of the device. An example of the tunnel barrier layer is an MgO layer that has the lattice constant close to those of GaAs and Ge and can be epitaxially grown.

The channel layer 122 is formed on the first source/drain layer 121. The channel layer 122 is, here, a semiconductor layer formed of semiconductor, specifically, a III-V compound semiconductor layer or a group IV semiconductor layer formed of GaAs or Ge.

The second source/drain layer 123 is formed on the channel layer 122. The second source/drain layer 123 is, here, a two-layer film formed by sequentially stacking a nonmagnetic layer 123A formed of nonmagnetic material, and a magnetic layer 123B formed of magnetic material. The nonmagnetic layer 123A is, here, a tunnel barrier layer that functions as a tunnel barrier. The tunnel barrier layer provided in the second source/drain layer 123 functions as a diffusion barrier and contributes to improvement of breakdown voltage of the device. An example of the tunnel barrier layer is an MgO layer that has the lattice constant close to those of GaAs and Ge and can be epitaxially grown. The magnetic layer 123B is, here, an $Fe_3Si$ ferromagnetic layer formed of $Fe_3Si$. The magnetic layer 123B may be a full Heusler alloy magnetic thin film. As full Heusler alloys adopted for the magnetic layer 123B, due to a high ferromagnetic transition temperature and the like, Co full Heusler alloys such as $Co_2FeAl_xSi_{1-x}$ and $Co_2MnSi_xAl_{1-x}$ are preferable.

The magnetic recording layer 161 is formed on the second source/drain layer 123. The magnetic recording layer 161 is, here, a magnetic layer formed of magnetic material, specifically, an antiferromagnetic ferroelectric layer, a ferromagnetic ferroelectric layer, or a ferrimagnetic ferroelectric layer formed of antiferromagnetic ferroelectric material, ferromagnetic ferroelectric material, or ferrimagnetic ferroelectric material. As magnetic materials adopted for the magnetic recording layer 161, $Cr_2O_3$, $Bi_2FeCrO_6$, $Bi_{1-x}Ba_xFeO_3$, BiFeO$_3$, a BaTiO$_3$—CoFe$_2$O$_4$ nanostructure, and a PbTiO$_3$—CoFe$_2$O$_4$ nanostructure are preferable.

The magnetic recording layer 161 is a layer for controlling the spin direction of the second source/drain layer 123 which includes a magnetic layer. In this embodiment, it is possible to perform spin writing by applying a voltage between a gate and a drain (or a gate and a source), as indicated by ±V in FIG. 8D. In this embodiment, since voltage application methods in writing and reading are different, it is unnecessary to pay attention to the margin of voltages in writing and reading. This is an example indicating that voltage control writing scheme is more excellent than spin injection writing scheme. In this embodiment, it is possible to change the spin direction (the magnetization direction) of the second source/drain layer 123 according to a change in the voltage ±V.

The vertical spin transistor 101 includes the protruding structure 202 including the channel layer 122, the second source/drain layer 123, and the magnetic recording layer 161. The shape of the protruding structure 202 is, here, plate-like. However, the shape of the protruding structure 202 does not have to be plate-like. The first and second source/drain layers 121 and 123 are a source layer and a drain layer, respectively. However, the first and second source/drain layers 121 and 123 may be a drain layer and a source layer, respectively.

1) Magnetic Recording Layer 161

In the second to fifth embodiments, the spin transistor 101 has the magnetic recording layer 161. Therefore, in the second to fifth embodiments, as in the first embodiment, it is possible to change a characteristic of the transistor 101 after the transistor 101 is formed.

In these embodiments, both of the upper source/drain layer 123 and the lower source/drain layer 121 include magnetic layers. However, in these embodiments, although the magnetic recording layer 161 for controlling the spin direction of the upper source/drain layer 123 is provided, a magnetic recording layer for controlling the spin direction of the lower source/drain layer 121 is not provided. This is because, for the purpose of controlling coincidence and anticoincidence of the spin directions of the upper source/drain layer 123 and the lower source/drain layer 121, it is unnecessary to provide spin rewrite mechanisms for both of the source/drain layers, and it is sufficient to provide a spin rewrite mechanism for one of the source/drain layers. In these embodiments, when the device is formed, both of the upper source/drain layer 123 and the lower source/drain layer 121 are magnetized, and the spin directions of the source/drain layers are aligned. On the other hand, when the characteristic of the transistor 101 is changed, the spin direction of the upper source/drain layer 123 is rewritten, and the characteristic of the transistor 101 is changed.

Moreover, in these embodiments, a vertical structure is adopted as a structure of the spin transistor 101. Therefore, in these embodiments, it is possible to provide the magnetic recording layer 161 above the vertical structure, i.e., above the upper source/drain layer 123. Therefore, in these embodiments, it is possible to easily form the magnetic recording layer 161.

2) Method of Manufacturing the Vertical Spin Transistor 101

A method of manufacturing the vertical spin transistor 101 according to the second to fifth embodiments, is substantially the same as the method of manufacturing the vertical spin transistor 101 according to the first embodiment. Main differences are that the magnetic recording layer 161 is deposited on the second source/drain layer 123 at the end of the process in FIG. 7C, the protruding structure 202 including the magnetic recording layer 161, the second source/drain layer 123, and the channel layer 122 is formed in the processing in FIG. 7D, and it is unnecessary to form the spin writing line 142 in the process in FIG. 7H.

3) Vertical Structure of the Vertical Spin Transistor 101

The first source/drain layer 121 according to the first to fifth embodiments is a layer entirely or partially formed of magnetic material. For example, the first source/drain layer 121 according to the second embodiment is a layer entirely formed of magnetic material, and includes only a magnetic layer. For example, the first source/drain layer 121 according to the third embodiment is a layer partially formed of magnetic material, and includes a magnetic layer and a nonmagnetic layer.

Similarly, the second source/drain layer 123 according to the first to fifth embodiments is a layer entirely or partially formed of magnetic material. For example, the second source/drain layer 123 according to the fourth embodiment is a layer entirely formed of magnetic material, and includes only a magnetic layer. For example, the second source/drain layer 123 according to the fifth embodiment is a layer partially formed of magnetic material, and includes a magnetic layer and a nonmagnetic layer.

The channel layer 122 according to the first to fifth embodiments is a single layer film including one semiconductor layer. However, the channel layer 122 may be a multilayer film including two or more semiconductor layers.

In this way, each of the vertical spin transistors 101 according to the first to fifth embodiments includes the first source/drain layer 121 including a layer formed of magnetic material (a magnetic layer), the channel layer 122 including a layer formed of semiconductor (a semiconductor layer), and the second source/drain layer 123 including a layer formed of magnetic material (a magnetic layer). An example of these magnetic layers is an Fe$_3$Si layer. Each of these magnetic layers may be a full Heusler alloy layer. Examples of the semiconductor layer are a GaAs layer (a III-V compound semiconductor layer) and a Ge layer (a group IV semiconductor layer). The semiconductor layer may be a strained semiconductor layer. A layer on which the vertical transistor 101 is formed may be a Ge substrate or a GOI layer of a GOI substrate.

The magnetic recording layer 161 according to the second to fifth embodiments is a layer entirely or partially formed of magnetic material. For example, the magnetic recording layer 161 according to the second embodiment is a layer partially formed of magnetic material, and includes a magnetic layer and a nonmagnetic layer. For example, the magnetic recording layer 161 according to the fourth embodiment is a layer entirely formed of magnetic material, and includes only a magnetic layer.

As described above, embodiments of the present invention provide, concerning a transistor and a method of manufacturing the same, a spin transistor having a new structure and a method of manufacturing the same.

What is claimed is:

1. A vertical spin transistor comprising:
   a first source/drain layer including a layer formed of magnetic material;
   a protruding structure including,
      a channel layer formed on the first source/drain layer including a layer formed of semiconductor, and formed of nonmagnetic material, and
      a second source/drain layer formed on the channel layer and including a layer formed of magnetic material;

a gate insulating film formed on a side of the channel layer; and a gate electrode formed on a surface of the gate insulating film.

2. The vertical spin transistor according to claim 1, wherein the first source/drain layer is formed on a semiconductor layer.

3. The vertical spin transistor according to claim 2, wherein the semiconductor layer is an Si layer, an SiGe layer, or a Ge layer.

4. The vertical spin transistor according to claim 2, wherein the semiconductor layer is formed on an insulating film formed on a semiconductor substrate.

5. The vertical spin transistor according to claim 1, wherein the first source/drain layer is formed on a semiconductor substrate.

6. The vertical spin transistor according to claim 2, wherein a surface of the semiconductor layer is a (100) plane or a (110) plane.

7. The vertical spin transistor according to claim 2, wherein
the semiconductor layer includes a Ge layer, each of the first and second source/drain layers includes an $Fe_3Si$ layer, and the channel layer includes a GaAs layer or a Ge layer.

8. The vertical spin transistor according to claim 2, wherein lattice mismatching between the semiconductor layer and the channel layer is smaller than 1%.

9. The vertical spin transistor according to claim 1, wherein the channel layer includes a layer formed of III-V compound semiconductor or group IV semiconductor.

10. The vertical spin transistor according to claim 1, wherein the layer formed of semiconductor is formed of strained semiconductor.

11. The vertical spin transistor according to claim 1, wherein each of the first and second source/drain layers includes a full Heusler alloy layer.

12. The vertical spin transistor according to claim 1, wherein the first source/drain layer further includes a layer formed of nonmagnetic material.

13. The vertical spin transistor according to claim 1, wherein the second source/drain layer further includes a layer formed of nonmagnetic material.

14. The vertical spin transistor according to claim 1, further comprising:
an insulating layer formed on the second source/drain layer; and a spin writing line formed on the insulating layer.

15. The vertical spin transistor according to claim 1, further comprising a magnetic recording layer formed on the second source/drain layer.

16. The vertical spin transistor according to claim 15, wherein the magnetic recording layer includes a layer formed of magnetic material.

17. The vertical spin transistor according to claim 16, wherein the magnetic recording layer further includes a layer formed of nonmagnetic material.

18. A method of manufacturing a vertical spin transistor, the method comprising:
forming a first source/drain layer including a layer formed of magnetic material;

forming a protruding structure including,
a channel layer formed on the first source/drain layer and including a layer formed of semiconductor, and formed of nonmagnetic material, and a second source/drain layer formed on the channel layer including a layer formed of magnetic material;

forming a gate insulating film formed on a side of the channel layer; and forming a gate electrode formed on a surface of the gate insulating film.

19. The method according to claim 18, further comprising:
forming an insulating layer on the second source/drain layer; and forming a spin writing line on the insulating layer.

20. The method according to claim 18, further comprising forming a magnetic recording layer on the second source/drain layer.

21. The vertical spin transistor according to claim 1 further comprising:
a spin rewriting part for controlling a coincidence and an anticoincidence between a spin direction of the first source/drain layer and a spin direction of the second source/drain layer.

22. The method according to claim 18, further comprising:
forming a spin rewriting part for controlling a coincidence and an anticoincidence between a spin direction of the first source/drain layer and a spin direction of the second source/drain layer.

* * * * *